US009651933B2

(12) United States Patent
Wand et al.

(10) Patent No.: US 9,651,933 B2
(45) Date of Patent: May 16, 2017

(54) PEAK DETECTION CIRCUIT AND METHOD

(71) Applicant: Magna E-Car Systems of America, Inc., Auburn Hills, MI (US)

(72) Inventors: Thomas J. Wand, Canton, MI (US); Roger Douglas, Waterford, MI (US)

(73) Assignee: Magna E-Car Systems of America, Inc., Auburn Hills, MI (US)

( * ) Notice: Subject to any disclaimer, the term of this patent is extended or adjusted under 35 U.S.C. 154(b) by 0 days.

(21) Appl. No.: 14/369,815

(22) PCT Filed: Dec. 19, 2012

(86) PCT No.: PCT/US2012/070548
§ 371 (c)(1),
(2) Date: Jun. 30, 2014

(87) PCT Pub. No.: WO2014/058445
PCT Pub. Date: Apr. 17, 2014

(65) Prior Publication Data
US 2015/0137728 A1 May 21, 2015

Related U.S. Application Data

(60) Provisional application No. 61/711,787, filed on Oct. 10, 2012.

(51) Int. Cl.
*G05B 19/31* (2006.01)
*G01D 5/14* (2006.01)
(Continued)

(52) U.S. Cl.
CPC ............... *G05B 19/31* (2013.01); *G01D 5/14* (2013.01); *G01R 1/203* (2013.01); *G01R 1/30* (2013.01);
(Continued)

(58) Field of Classification Search
USPC ........... 318/605, 661; 341/114, 116; 361/236
See application file for complete search history.

(56) References Cited

U.S. PATENT DOCUMENTS 3,231,885 A * 1/1966 Blauvelt ................ G08C 19/46
341/116
4,804,900 A * 2/1989 Soeda .................... H02P 25/024
318/719
(Continued)

FOREIGN PATENT DOCUMENTS

WO 2011006742 A1 1/2011

*Primary Examiner* — Eduardo Colon Santana
*Assistant Examiner* — Iftekhar Mustafa
(74) *Attorney, Agent, or Firm* — Dickinson Wright PLLC

(57) ABSTRACT

A circuit is provided for detecting peaks of a sinusoidal input signal includes circuitry for generating first and second sinusoidal output signals that are out of phase with one another and with the sinusoidal input signal. A comparator block compares the sinusoidal output signals to determine instances where the amplitudes of the first and second sinusoidal output signals cross over each other. The sinusoidal output signals may lead the sinusoidal input signal somewhat so that, after taking into account processing delay, the indicated crossover instances substantially coincide with peaks in the sinusoidal input signal such that a trigger signal generated by the circuit accurately indicates the timing of the peaks.

12 Claims, 8 Drawing Sheets

(51) Int. Cl.
- *G01R 1/20* (2006.01)
- *G01R 1/30* (2006.01)
- *G01R 25/00* (2006.01)
- *G01R 19/175* (2006.01)
- *G01R 19/04* (2006.01)

(52) U.S. Cl.
CPC ........... *G01R 19/175* (2013.01); *G01R 25/00* (2013.01); *G01R 19/04* (2013.01)

(56) References Cited

U.S. PATENT DOCUMENTS

| | | | | |
|---|---|---|---|---|
| 4,857,926 | A * | 8/1989 | Neglia | G01D 5/208 318/656 |
| 5,455,498 | A * | 10/1995 | Kakimoto | G01D 5/243 318/605 |
| 5,471,361 | A * | 11/1995 | Wootton | G01P 3/488 307/106 |
| 6,198,350 | B1 * | 3/2001 | Zarabadi | H03F 3/45179 327/307 |
| 7,050,313 | B2 * | 5/2006 | Huang | H02M 7/2176 363/128 |
| 7,340,012 | B2 | 3/2008 | Brown et al. | |
| 7,859,254 | B2 * | 12/2010 | Nakazato | G01D 5/2451 324/207.25 |
| 2007/0126386 | A1 * | 6/2007 | Yunus | H02P 6/182 318/400.04 |

* cited by examiner

PEAK DETECTION CIRCUIT AND METHOD

CROSS-REFERENCE TO RELATED APPLICATIONS

This application is a U.S. National Stage of International Application No. PCT/US2012/070548 filed Dec. 19, 2012 which claims the benefit of U.S. Provisional Application No. 61/711,787, filed on Oct. 10, 2012. The entire disclosure of each of the above application is incorporated herein by reference.

FIELD

The present disclosure relates to the art of signal processing and, more particularly, to a circuit and method for identifying the timing of positive and negative peaks in a sinusoidal signal.

BACKGROUND

This section provides background information related to the present disclosure which is not necessarily prior art.

Circuits for detecting the amplitudes of peaks in a sinusoidal signal are known. For example, AM radio utilizes an amplitude-modulated sinusoid signal that is decoded via a peak detector. In inexpensive AM radios, the peak detector is a half wave rectifier in which a diode is used to charge a capacitor to a voltage approximating the peak. This and other conventional types of peak detectors utilize a sample and hold strategy. The problem with such a strategy is that it may not be accurate enough for certain applications, particularly in the digital domain where an analog to digital converter samples the signal. If the timing of the sample is off, for example due to a frequency shift, the result may be inaccurate for the purposes of the application.

The problem arises, for example, in digital motor controllers where commutation is controlled by an angular analog feedback sensor such as an absolute resolver. The resolver generates an amplitude-modulated sinusoidal feedback signal that carries the rotor angle. The analog feedback signal may need to be sampled in order to detect its peak levels, and it would be useful to have a peak detector that can provide relatively accurate readings of the peak timing.

SUMMARY

This section provides a general summary of the disclosure, and is not a comprehensive disclosure of its full scope or all of its features.

In accordance with one aspect of the present disclosure, a method of detecting peaks in a sinusoidal input signal includes (a) generating first and second sinusoidal output signals of the same frequency as the sinusoidal input signal that are out of phase with one another and with the sinusoidal input signal; (b) comparing the first and second sinusoidal output signals to determine instances where the amplitudes of the first and second sinusoidal output signals cross over each other; and (c) detecting the crossover instances and identifying the timing of the peaks in the sinusoidal input signal based on the timing of the crossover instances.

In the method of the present disclosure, the first and second sinusoidal output signals may lead the sinusoidal input signal so that the determination of a peak slightly leads the actual occurrence of the peak. This may be useful to provide downstream circuitry such as an analog to digital converter with sufficient time to set up and/or process the input signal closer to the actual occurrence of the peak.

The phasing of the first and second sinusoidal output signals may be provided by passing the sinusoidal input signal through two differentiators arranged in parallel, wherein each differentiator has a slightly different time constant than the other differentiator.

The method of the present disclosure may include adjusting the amplitude of at least one of the first and second sinusoidal output signals so that the amplitudes of the first and second sinusoidal output signals are substantially equal.

The method of the present disclosure may include adjusting the amplitude of at least one of the first and second sinusoidal output signals to adjust the time by which the crossover instances lead peaks in the sinusoidal input signal. The amplitudes of first and second sinusoidal output signals may therefore not necessarily be equal to one another.

The method of the present disclosure may include generating at least one rectangular wave signal, wherein transitions of the at least one rectangular wave signal are indicative of incidences of the peaks in the sinusoidal input signal.

In accordance with another aspect of the present disclosure, a method of converting an amplitude-modulated signal having a sinusoidal carrier and a modulating signal to digital values is provided. The method includes generating first and second sinusoidal output signals of the same frequency as the carrier that are out of phase with one another and with the carrier; comparing the first and second sinusoidal output signals to determine instances where the amplitudes of the first and second sinusoidal output signals cross over each other; sampling the amplitude-modulated signal at times corresponding to the crossover instances and converting the amplitude-modulated signal at the sampling times to digital values. In the method the first and second sinusoidal output signals may lead the sinusoidal input signal.

In accordance with another aspect of the present disclosure, a method of determining the rotor angle of a rotor is provided. The method includes: connecting an angular resolver to the rotor; exciting the resolver with a sinusoidal excitation signal so as to generate at least one sinusoidal amplitude-modulated signal comprising a carrier and a modulation signal, wherein the carrier has the same frequency as the excitation signal and the modulation signal is a sinusoidal function of the rotor angle; generating first and second sinusoidal output signals of the same frequency as the carrier that are out of phase with one another and with the carrier; comparing the first and second sinusoidal output signals to determine instances where the amplitudes of the first and second sinusoidal output signals cross over each other; detecting the crossover instances and generating a trigger signal which has transitions corresponding to the crossover instances; generating a digital modulation signal by converting the amplitude-modulated signal to digital values with an analog to digital converter, wherein the analog to digital converter samples the at least one amplitude-modulated signal at times corresponding to the transitions in the trigger signal; and determining the rotor angle by calculating an inverse of the digital modulation signal. In the method the first and second sinusoidal output signals may lead the sinusoidal input signal.

In accordance with another aspect of the present disclosure, a method for controlling the commutation of an electric motor is provided, wherein the motor has a rotor and a resolver that provides feedback as to the rotor angle. The method includes: (a) determining a rotor angle of the rotor using a resolver circuit, wherein the resolver circuit generates a sinusoidal excitation signal that is applied to the resolver, the resolver generates at least one amplitude-modulated sinusoidal resolver output signal in response to the excitation signal, and the resolver circuit receives and decodes the at least one resolver output signal to provide the rotor angle; (b) commutating the motor based on the rotor angle provided by the resolver circuit; (c) determining a redundant rotor angle by generating first and second sinusoidal output signals of the same frequency as the excitation signal that are out of phase with one another and with the excitation signal, comparing the first and second sinusoidal output signals to determine instances where the amplitudes of the first and second sinusoidal output signals cross over each other, detecting the crossover instances and sampling the at least one amplitude-modulated signal at times corresponding to the crossover instances in order to generate a digital modulation signal, and determining the redundant rotor angle by calculating an inverse of the digital modulation signal; and (d) comparing the rotor angle determined in step (a) against the redundant rotor angle determined in step (c) in order to provide a diagnostic condition of the resolver circuit.

In accordance with this method of the present disclosure the first and second sinusoidal output signals may lead the sinusoidal input signal.

In accordance with another aspect of the present disclosure, a circuit is provided for determining peaks in a sinusoidal input signal. The circuit includes first and second differentiators arranged in parallel. The first differentiator has a different time constant than the second differentiator. The sinusoidal input signal is applied to the first and the second differentiators to thereby generate first and second sinusoidal output signals that are out of phase with one another and with the sinusoidal input signal. A comparison block receives the slightly out-of-phase first and second sinusoidal output signals and generates at least one rectangular wave signal having transitions substantially coinciding with instances where the amplitudes of the first and second sinusoidal output signals cross over each other. The transitions indicate the timing of peaks in the sinusoidal input signal.

The first and second differentiators may provide the first and second sinusoidal output signals so as to slightly lead the sinusoidal input signal. This may be useful to provide downstream circuitry such as an analog to digital converter with sufficient time to set up and/or process the input signal closer to the actual occurrence of the peak.

The first and second differentiators may be arranged to have a first input terminal connected to a capacitor, a second input terminal connected to a resistor, and an output terminal connected to the resistor. The sinusoidal input signal may be applied to the differentiator first input terminal and the differentiator output terminal may be connected to the comparison block. In addition, a DC reference voltage may be applied to the differentiator second input terminal. The DC reference voltage may be provided by a DC reference level generator that generates a DC reference voltage representative of DC bias voltage carried by the sinusoidal input signal.

An additional resistor may be connected to the capacitor of at least one of the first and second differentiators. The additional resistor may be sized to adjust the amplitude of at least one of the first and second sinusoidal output signals so that the amplitudes of the first and second sinusoidal output signals are substantially equal.

The time constants may be set so that the amplitude of one of the first and second sinusoidal output signals is lower than the amplitude of the other of the first and second sinusoidal output signals in order to time the crossover instances of the first and second sinusoidal output signals prior to the peaks of the sinusoidal input signal.

A modulator may be connected to the first and second differentiators for adjusting the relative amplitudes of the first and second sinusoidal output signals based on an input signal. The input signal may include at least one of: a frequency of the sinusoidal input frequency; a current, a voltage; a temperature; and a sensitivity value.

The comparison block may incorporate a single comparator that generates a single square wave signal and a current source is connected to an output of the comparator to provide fast rising edge and falling edge transitions in the single square wave signal.

Alternatively, the comparison block may incorporate dual comparators that generates first and second square wave signals. In this case, the circuit may further include third and fourth differentiators arranged in parallel which receive the first and second square wave signals, respectively, and generate first and second trigger signals. A dual input flip flop may be connected to the third and fourth differentiators, the flip flop being set and reset by the first and second trigger signals.

The circuit may also include a buffer for receiving the sinusoidal input signal and generating a low impedance reproduction of the sinusoidal input signal that is fed to the first and second differentiators.

In accordance with another aspect of the present disclosure, a system is provided for controlling the commutation of an electric motor having a rotor and a resolver that provides feedback as to the rotor angle. The system includes a resolver circuit and a microcontroller connected to the resolver circuit via a communications bus. The resolver circuit generates a sinusoidal excitation signal that is applied to the resolver, the resolver generates at least one amplitude-modulated sinusoidal resolver output signal in response to the excitation signal, the resolver circuit receives and decodes the at least one resolver output signal to provide rotor angle information to the microcontroller over the communications bus. The microcontroller controls the commutation of the motor based on the rotor angle information.

The system includes a redundant rotor angle feedback circuit which includes a peak detector. The microcontroller receives the at least one resolver output signal, and the peak detector receives the sinusoidal excitation signal and generates a trigger signal that is connected to the microcontroller to inform the microcontroller when to sample the at least one resolver output signal. The microcontroller redundantly determines the rotor angle based on the at least one resolver output signal and the trigger signal.

The peak detector of this system includes first and second differentiators and a comparison block. The first and second differentiators are arranged in parallel, with the first differentiator having a slightly different time constant than the second differentiator. The excitation signal is simultaneously applied to the first and the second differentiators to thereby generate first and second sinusoidal output signals that are slightly out of phase with one another and with the excitation signal. The comparison block receives the slightly out-of-phase first and second sinusoidal output signals and generates the trigger signal which has transitions that substantially coincide with instances where the amplitudes of the first and second sinusoidal output signals cross over each other. These transitions indicate the timing of peaks in the excitation signal and the at least one resolver output signal.

The microcontroller may sample the at least one resolver output signal via a digital to analog converter circuit, and the first and second differentiators may provide the first and second sinusoidal output signals so as to slightly lead the excitation signal and thus provide a more accurate sampling of peak values.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

The foregoing and other aspects will now be described by way of example only with reference to the attached drawings, in which.

DETAILED DESCRIPTION

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Figure 1:
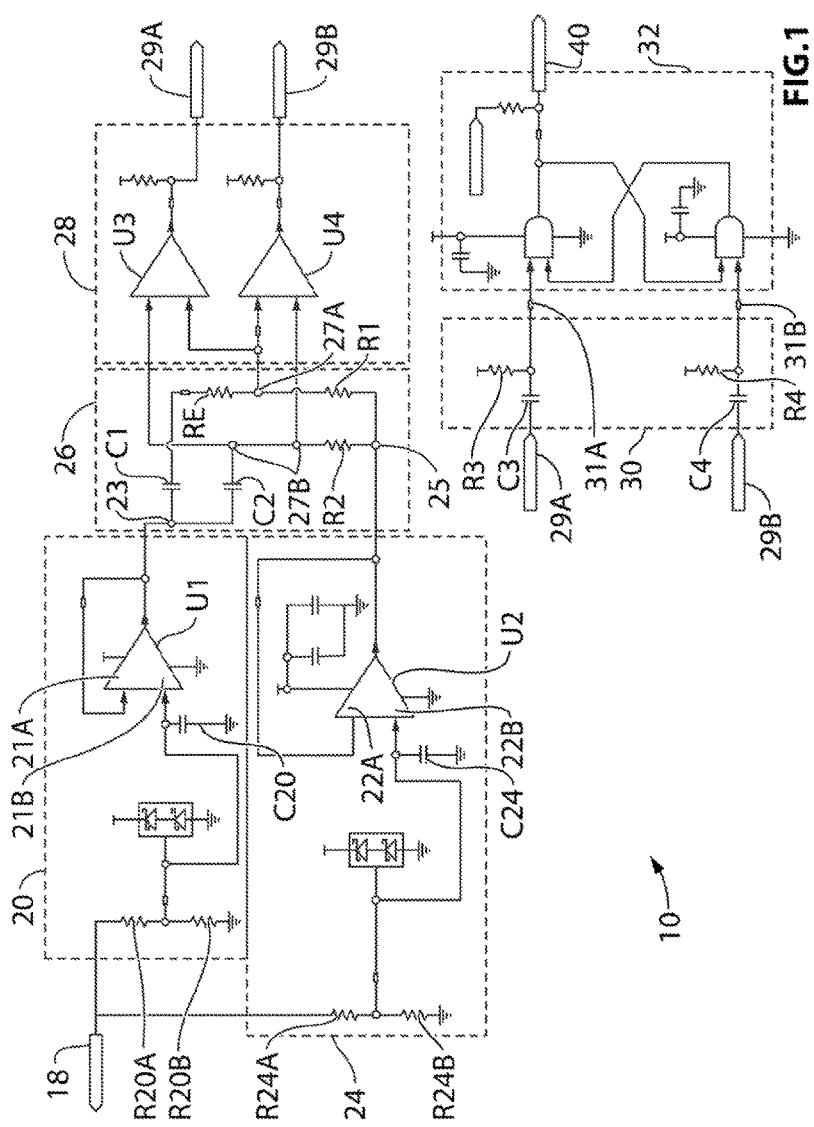
FIG. 1 is a circuit diagram of a first example of a peak detection circuit which utilizes two differentiators having slightly different time constants.

A first embodiment of a peak detector circuit 10 is shown in FIG. 1. The circuit 10 receives a sinusoidal input signal 60 (see FIG. 2) at input node 18. The sinusoidal input signal 60 may have a non-zero DC center voltage (i.e., the input signal may have a DC offset voltage which is removed from view on FIG. 2). The circuit 10 provides a rectangular wave output signal 85 (see FIG. 2) at output node 40. The transitions of the output signal 85 indicate the timing of positive and negative peaks in the sinusoidal input signal 60.

The circuit 10 can be logically decomposed into a functional block arrangement as indicated by the stippled lines in FIG. 1. Considering the circuit 10 at a system level perspective, the sinusoidal input signal 60 is fed to a buffer block 20 arranged in parallel with a DC reference level generator block 24. Blocks 20 and 24 are connected to a dual high pass filter block 26 that generates two sinusoidal output signals 62 and 64 (see FIG. 2) that are slightly out of phase with each other and with respect to the sinusoidal input signal 60. The dual high pass filter block 26 is connected to a dual comparator block 28 which, as discussed in greater detail below, generates two square waves 72 and 74 (see FIG. 2) based on the positive and negative crossing points of the out-of-phase sinusoidal output signals 62 and 64. The transitions in the square waves 72 and 74 thus provide information on the timing of the positive and negative peaks of the sinusoidal input signal 60. The comparator block 28 is connected to a dual differential block 30 which is in turn connected to an RS flip flop 32. These blocks 30 and 32 serve to rapidly capture the transitions in the square waves 72 and 74 and combine the two transitions of interest into one signal and thus help to immunize the circuit 10 from noise.

More particularly, the buffer block 20 includes an operational amplifier U1 that receives the sinusoidal input signal 60 at a non-inverting input 21B of U1. In FIG. 1 the sinusoidal input signal 60 is filtered through a high frequency low pass filter provided by resistors R20A, R20B and capacitor C20 (which has a small value) to reduce any noise present on the sinusoid input signal 60, but these passive components R20A, R20B and C20 may be omitted in practice. Output 23 of U1 is fed back to an inverting input 21A of U1, forming a voltage follower, and the sinusoidal input signal 60 is thus reproduced at the amplifier output point 23. In this manner the buffer block 20 isolates the sinusoidal input signal 60 from other circuitry and provides a low impedance reproduction of the input signal 60 as the input to the remainder of the circuit 10. A low impedance reproduction of the input signal 60 is a reproduction of the input signal 60 but with a lower impedance than the impedance of the input signal. It will be understood that the buffer block 20 may be omitted in practice, particularly if the low noise filter provided by R20A and C20 is not required.

The DC reference level generator block 24 provides a DC reference voltage at an output node 25 that is equivalent to the DC bias in the sinusoidal input signal 60. The DC reference level generator block 24 includes a capacitor C24 and resistors R24A and R24B as well as an operational amplifier U2. The DC reference level generator block 24 receives the sinusoidal input signal 60 at resistor R24A which, combined with capacitor C24 and resistor R24B, is used to provide a single order low pass filter due to the relatively large value of the capacitor C24. The single order filter may be omitted in practice and any low pass filter of any order may be used. The output of the low pass filter at capacitor C24 is fed to a non-inverting input 22B of the amplifier U2. Output 25 of the amplifier U2 is fed back to an inverting input 22A of amplifier U2. Amplifier U2 thus functions as a voltage follower and, in combination with the low pass filter (R24A, R24B, C24), the center voltage of the sinusoidal input signal 60 is thus provided at node 25.

The dual high pass filter block 26 includes two differentiators arranged in parallel. One differentiator is provided by a series arrangement of capacitor C1 and resistor R1 and the other differentiator is provided by a series arrangement of capacitor C2 and resistor R2. In each case, it will be noted that the buffered input signal at node 23 is provided as an input to one side of each differentiator and the DC reference voltage of the input signal at node 25 is provided as an input to the other side of each differentiator (at the base of each resistor R1 and R2). With the outputs of the differentiators being provided at nodes 27A and 27B, respectively, corresponding to the opposite terminals of the resistors R1 and R2, the effect of any DC offset in the buffered input signal is eliminated.

Figure 2:
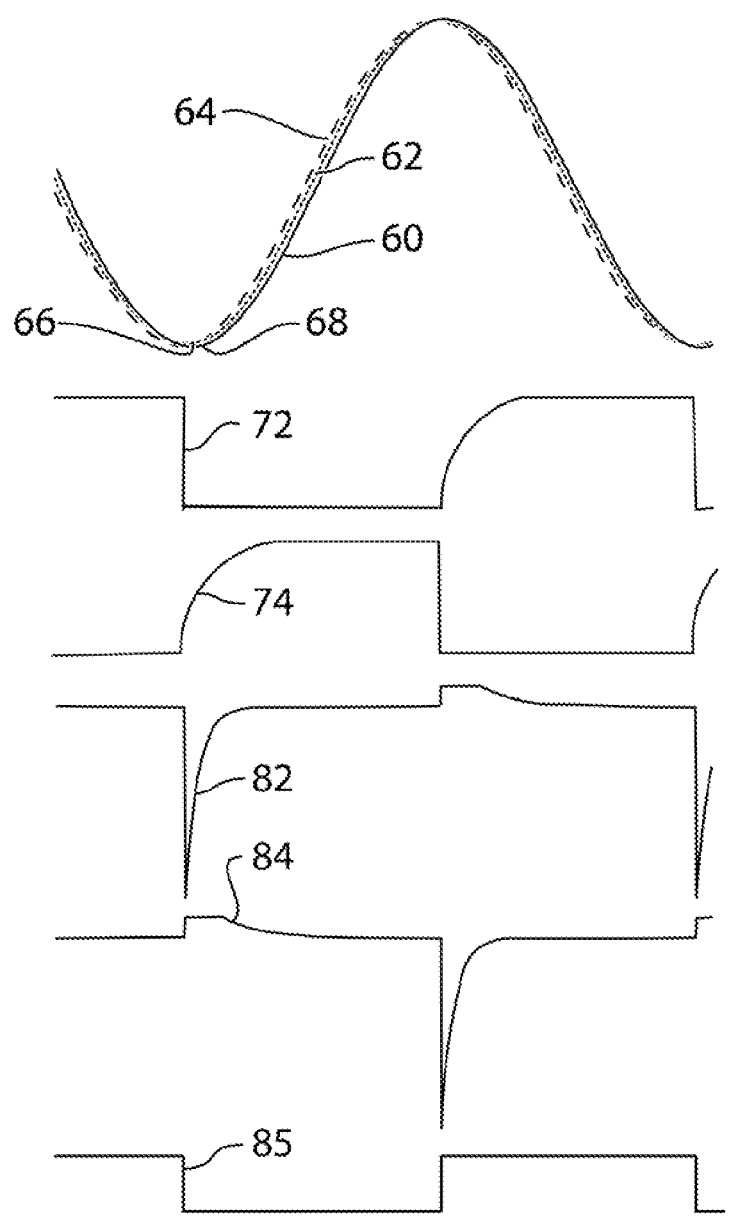
FIG. 2 is timing diagram showing various waveforms at various nodes in the peak detection circuit shown in FIG. 1.

The values of R1*C1 and R2*C2 are slightly different to yield slightly different time constants. Thus, as seen in FIG. 2, the differentiator provided by R1 and C1 provides one sinusoidal output signal 62 and the differentiator provided by R2 and C2 provides the other sinusoidal output signal 64. For example, in a circuit intended to track a 10 kHz sinusoid, values for resistor R1 and capacitor C1 may be 1.2 kilo-Ohm and 0.1 micro-Farad, respectively, and values for resistor R2 and capacitor C2 may be 1.0 kilo-Ohm and 0.1 micro-Farad, respectively.

The first and second sinusoidal output signals 62 and 64 are out of phase with each other, and out-of-phase with the sinusoidal input signal 60. As the circuit 10 determines the timing of the crossover point between the sinusoidal output signals 62 and 64, the amplitudes of both sinusoidal output signals 62 and 64 may be maintained at substantially equal levels so as not to skew the crossover point. To this end a small resistor RE may be placed in series with the capacitor of the differentiator that processes the signal with the larger amplitude. In FIG. 1, resistor RE is connected to capacitor C1 and the differentiator provided by R1 and C1 (and as a result, although RE may be small, the time constant of this differentiator as shown in FIG. 1 is determined by R1+RE and C1).

Figure 3:
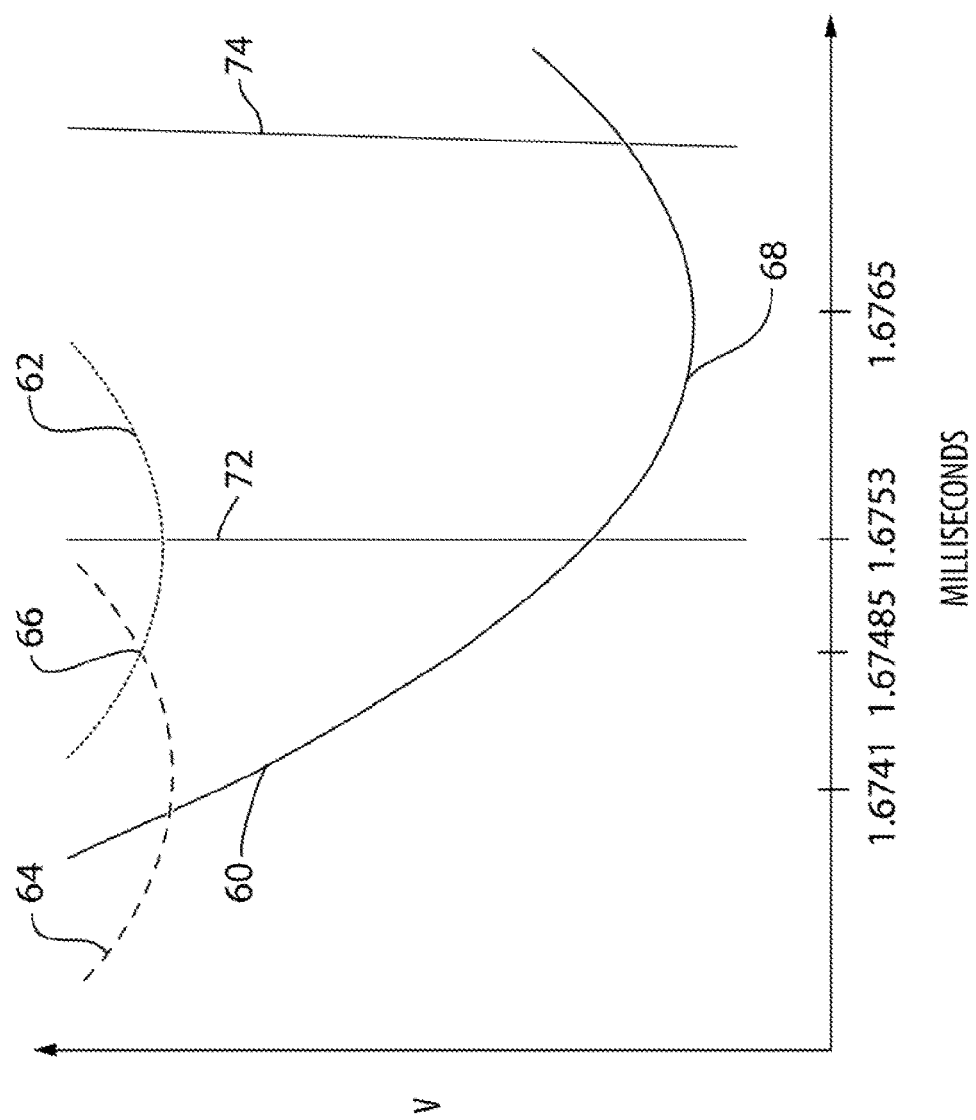
FIG. 3 is detail view of a portion of the timing diagram shown in FIG. 2.

As seen best in the detail view of FIG. 3, the out-of-phase sinusoidal output signals 62 and 64 slightly lead the sinusoidal input signal 60 because the responsiveness of the capacitors C1 and C2 to the applied sinusoidal voltage and currents is logarithmic. The leading nature of the out-of-phase sinusoidal output signals 62 and 64 is advantageous in that downstream circuitry is allowed time to process the sinusoidal output signals 62 and 64 as described in greater detail below so that the downstream processing can be performed at substantially the precise instant the peak occurs. Consequently the recognition of a crossover point by the downstream processing circuitry will coincide more closely with the actual occurrence of a corresponding peak in the sinusoidal input signal 60.

The dual comparator block 28 processes the sinusoidal output signals 62 and 64 to identify crossover points. More particularly, the dual comparator block 28 includes two comparators U3 and U4 arranged in parallel. The sinusoidal output signals 62 and 64 provided at nodes 27A and 27B are fed in an inverted relationship to the two comparators U3 and U4, that is, node 27A is connected to the non-inverting terminal of U3 and the inverting terminal of U4, whereas node 27B is connected to the inverting terminal of U3 and the non-inverting terminal of U4. Thus, one of the comparators U3 or U4 will transition during positive sinusoidal peaks and the other of the comparators U3 or U4 will transition during negative sinusoidal peaks. Consequently, the dual comparator block 28 generates the two roughly 50% square waves 72 and 74 at comparator output nodes 29A and 29B which, as seen in FIG. 2, transcend near crossover points 66 between the sinusoidal output signals 62 and 64.

The comparators U3 and U4 have open collector outputs and thus can switch low much faster than they can switch high. The dual comparator structure is advantageous because one of the comparators U3 and U4 will switch low while the other of the comparators U3 and U4 switches high. For example, the view of FIG. 3 shows the square wave signal 72 undergoing a low transition step or falling edge as a result of negative crossover point 66. It will be noted that this transition occurs about 1 microsecond after the negative crossover point 66, but due to the leading nature of the sinusoidal output signals 62 and 64 substantially coincides with peak 68 in the sinusoidal input signal 60. The other square wave signal 74 undergoes a high transition step or rising edge. Because of the higher slew rate this rising edge transition occurs slightly later in time but, as discussed next, is not acted on.

The square waves 72 and 74 are fed into the dual differential block 30 and RS flip flop 32. The dual differential block 30 includes two differentiators arranged in parallel. One differentiator, which is connected to the output node 29A of U3, is provide by a series combination of resistor R3 and capacitor C3. The other differentiator, which is connected to the output node 29B of U4, is provide by a series combination of resistor R4 and capacitor C4. The outputs of the dual differential block 30 are provided at nodes 31A and 31B, which are also the input points to the RS flip flop 32. As seen in FIG. 2, the dual differential block 30 generates sharp falling edge trigger signals 82 and 84 that are used to trigger the RS flip flop 32 and avoid undesired inputs to the RS flip flop 32 arising from the two square waves 72 and 74 or from noise in the sinusoidal input signal 60.

The RS flip flop 32 has an output at node 40. FIG. 2 shows the output signal 85 of the RS flip flop 32, from where it will be seen that the transitions in this signal indicate the timing of the positive and negative peaks of the sinusoidal input wave 60.

The peak detection circuit 10 is advantageous in that it can provide an indication of the timing of the sinusoidal peaks across a broad frequency range. This is primarily because the circuit 10 compares the sinusoidal input signal against itself so speed or frequency variations are not fatal to the detection. Conventional peak detectors sample and hold the amplitude of a signal to look for a peak. The sample and hold typically requires the use of analog to digital converters, which may be speed sensitive. The sample and hold methodology also typically employs software to attempt to predict the next peak based on history of a previous peak, so phase delays and frequency variations can have a material effect of the accuracy of peak detection. The circuit 10, however, is generally impervious to frequency variations and may be used with frequency modulated signals.

Figure 4:
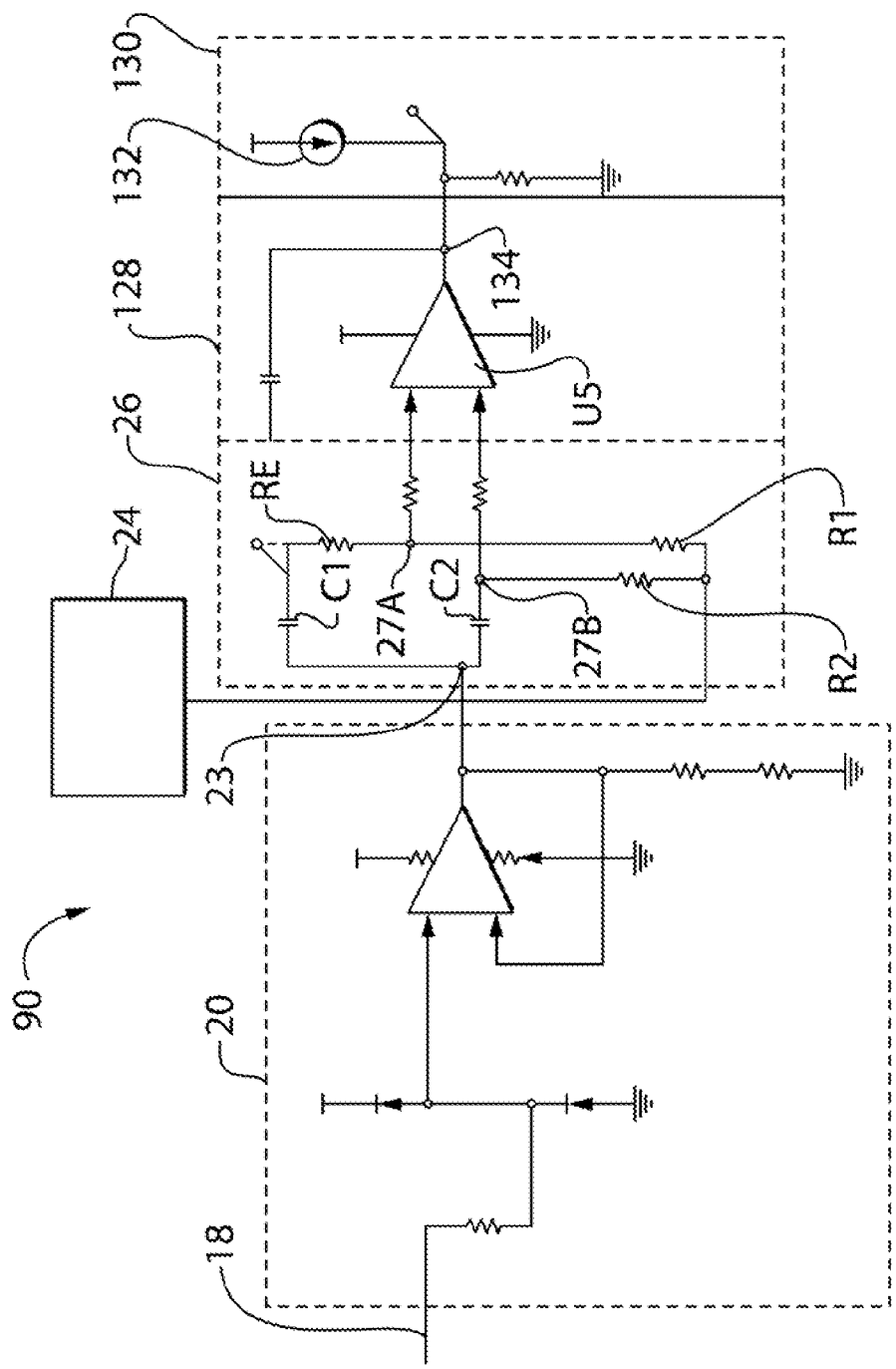
FIG. 4 is a circuit diagram of a second example of a peak detection circuit which utilizes two differentiators having slightly different time constants.

FIG. 4 shows a second embodiment of a peak detector circuit 90 that operates similarly to the peak detector circuit 10 of the first embodiment. The circuit 90 includes the buffer block 20 arranged in parallel with the DC reference level generator block 24. The blocks 20 and 24 in circuit 90 are connected to the dual high pass filter block 26 that generates the two slightly out-of-phase sinusoidal waves. In this embodiment, the dual high pass filter block 26 is connected to a single comparator block 128 (utilizing a single comparator U5) which generates a single square wave indicating both the positive and negative crossing points of the out-of-phase sinusoidal output signals. However, unlike the previous embodiment, this embodiment has an output stage 130 in which a current source 132 is used at the output of the comparator U5 instead of a pull up resistor which helps to obtain fast rising edge and fast falling edge transitions in the square wave at comparator output 134. This eliminates the need for the second comparator and the flip flop.

Figure 5:
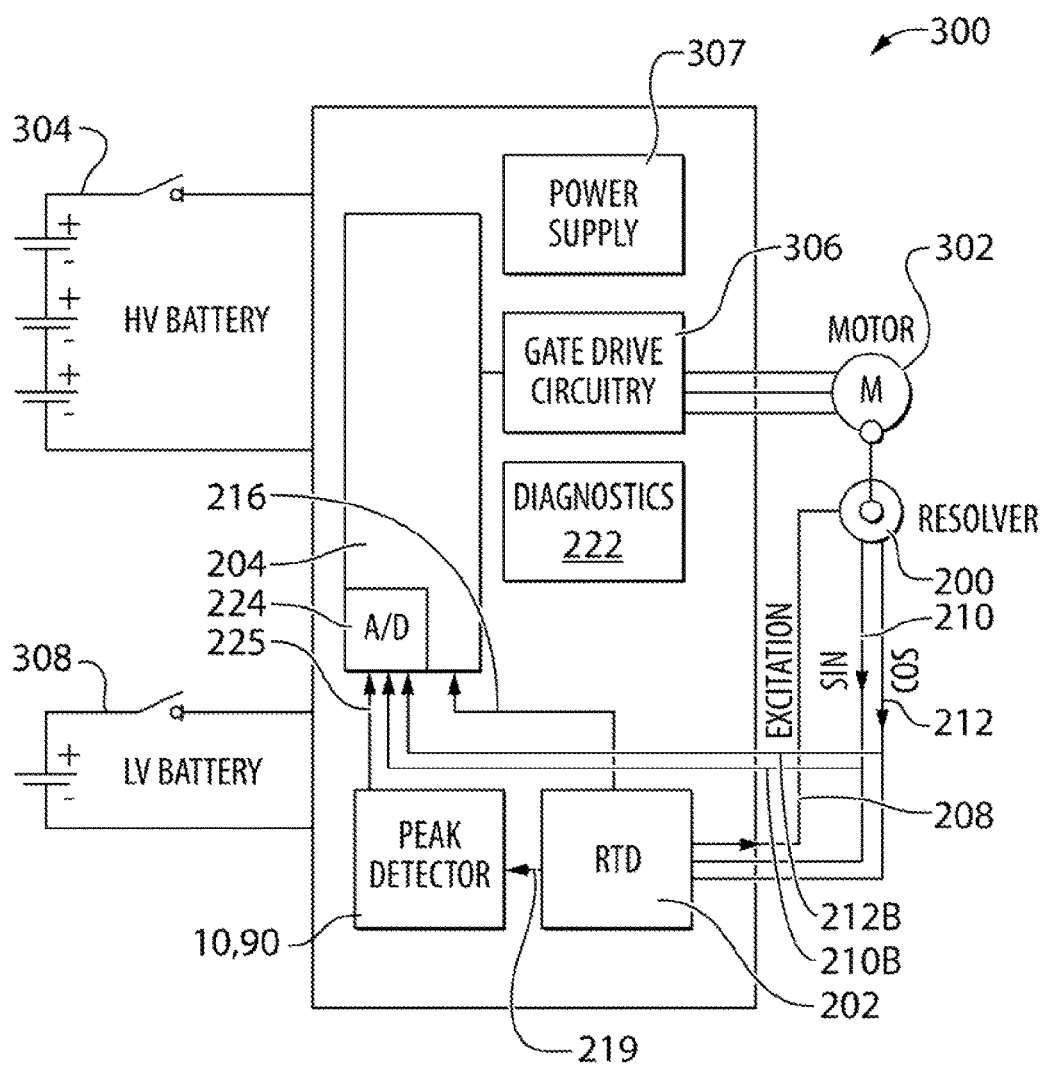
FIG. 5 is a system block diagram of a motor control system in which the peak detection circuits shown in FIG. 1 or FIG. 4 may be used.

The peak detection circuit 10 or 90 has particular utility when used as a backup in a motor control system such as an electric or hybrid electric vehicle motor control system 300 shown in FIG. 5. The motor control system 300 controls the operation of an electric motor, such as a stepper motor or a 3-phase commutated field permanent magnet motor, alternatively referred to as a 'synchronous' motor, 302. In a 3-phase synchronous motor the rotor carries permanent magnets and the stator has 3 field windings, as known in the art. Current is switched through the field windings in a specific order, rate and location relative to the rotor angle such that the varying field current induces a moving magnetic flux in the stator which interacts with the magnetic poles on the rotor to turn the rotor. The turning rotor provides torque to propel the vehicle.

In an electric or hybrid electric vehicle, the synchronous motor 302 is powered by a high voltage battery pack 304. The high voltage battery pack 304 is connected to gate drive circuitry 306, which includes a 3-phase bridge, as well known in the art. The gate drive circuitry 306 selectively connects the phases of the synchronous motor field windings to the high voltage battery pack 304 to vary the field current and induce the moving magnetic flux in the stator. A microcontroller 204, which is powered by a power supply 307 connected to a low voltage vehicle accessory battery 308, controls the switches in the gate drive circuitry 306. The microcontroller 204 executes a pulse width modulation (PWM) control strategy to supply current to the field windings as well known in the art.

In order to efficiently commutate the field windings of the synchronous motor 302 it is desirable to determine the rotor angle with a relatively high degree of precision. For this purpose a resolver is mounted on the rotor to determine the rotor angle. The resolver may be, for example, an absolute angular position sensor such as provided by a variable reluctance resolver 200 as known in the art which converts the rotor angle to an electrical signal.

A rotational to digital converter (RTD) 202, an example of which is commercially available in an integrated circuit by Analog Devices part no. AD2S1205, is connected to the microcontroller 204 and to the resolver 200. The RTD 202 processes analog electrical signals from the resolver 200 and provides a digital rotor angle reading to the microcontroller 204. For example, as seen in FIG. 5, the RTD 202 excites windings in the resolver 200 with an excitation signal 208. Due to the particular arrangement of the windings in the resolver 200, when the resolver 200 is excited by the sinusoidal excitation signal 208 shown in FIG. 6 the resolver 200 generates sinusoidal output signals 210 and 212. Each output signal 210 or 212 is composed of a carrier provided by the excitation signal and a modulation signal that is a sinusoidal function of the rotor angle. More particularly, the output signal 210 has an envelope 210$e$ (shown in stippled lines) that is proportional to the sine of the rotor angle at any point in time and the output signal 212 has an envelope 212$e$ (shown in stippled lines) that is proportional to the cosine of the rotor angle at any point in time.

Figure 7:
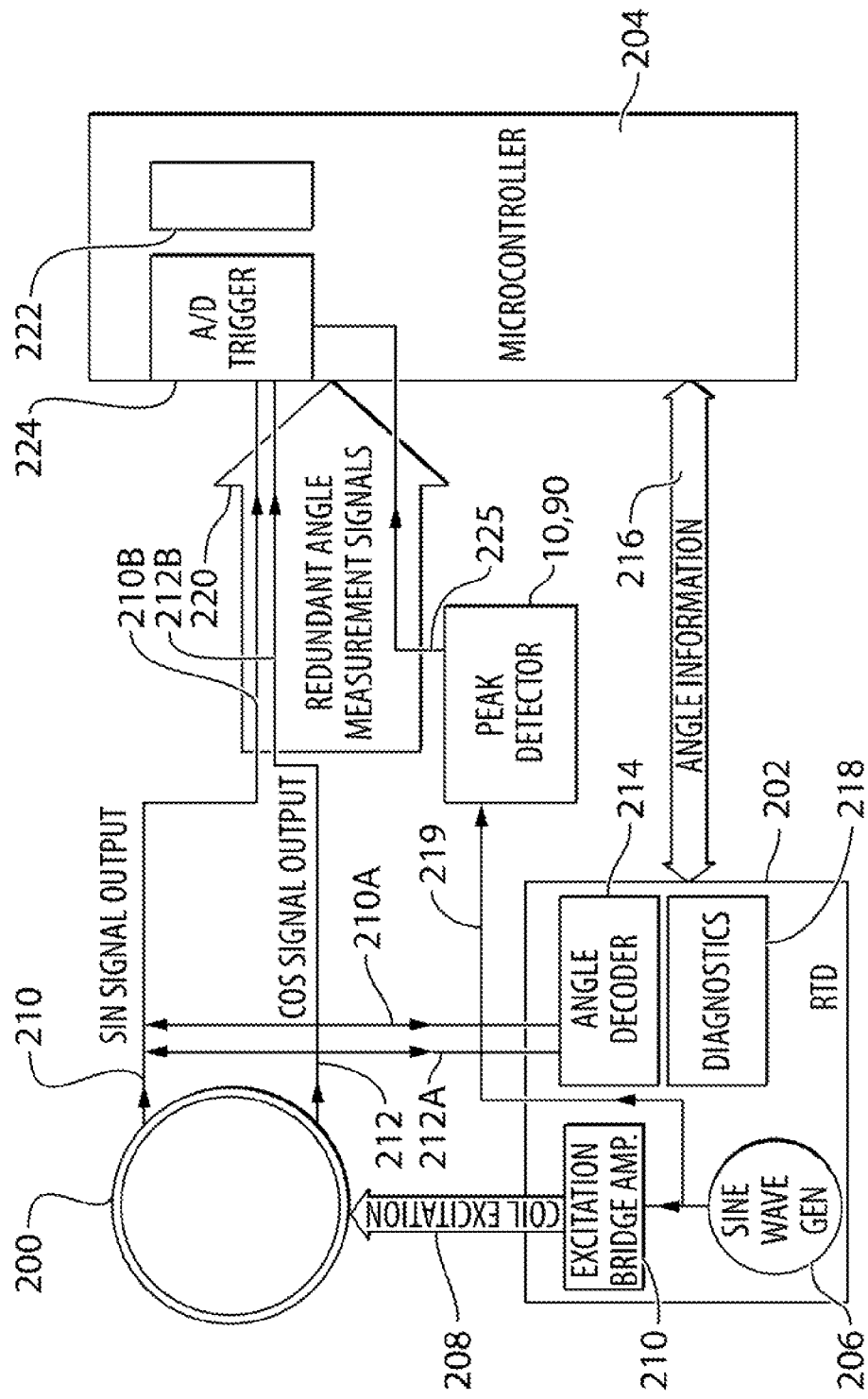
FIG. 7 is a detailed system block diagram of a portion of the motor control system shown in FIG. 5.

Referring additionally to a more detailed system block diagram view in FIG. 7, the RTD 202 includes a sinusoidal wave generator 206 that generates the excitation signal 208 which is amplified by an integral bridge amplifier 210 and applied to the resolver 200. The output signals 210 and 212 are transmitted via lines 210A, 212A to an angle decoder block 214 incorporated in the RTD 200 which decodes the output signals 210 and 212 and provides a reading of the rotor angle in digital form to the microcontroller 204 over a communication bus 216.

The RTD 202 includes an integral diagnostic function 218 in order to inform the supervising microcontroller 204 with the diagnostic condition of the RTD 202. As schematically illustrated in FIG. 5, the control system 300 provides the resolver output signals 210 and 212, via lines 210B, 212B, to the microcontroller 204, which may be provided with a memory 222 with programming code for redundantly determining the rotor angle. This redundant reading may be compared against the reading provided by the RTD 202 via the communication bus 216 and thus function as an independent diagnostic check on the condition of the RTD 202.

The microcontroller 204 includes an integral analog to digital (A/D) converter 224 for sampling the resolver output signals 210 and 212. As the resolver output signals 210 and 212 are amplitude-modulated, it is desirable for the microcontroller 204 to be able to sample each resolver output signal 210 or 212 at the instant when the resolver output signal 210 or 212 reaches a cyclic peak. Towards this end the excitation signal 208 from the sine wave generator 206, which in the illustrated embodiment has the same frequency and phase as the resolver output signals 210 and 212, is provided via line 219 as an input to the peak detector 10 or 90 and the peak detector 10 or 90 generates an output signal 225 that triggers the microcontroller A/D converter 224 to sample the resolver output signals 210 and 212 at instances when the resolver output signals 210 and 212 reach cyclic peaks.

Figure 6:
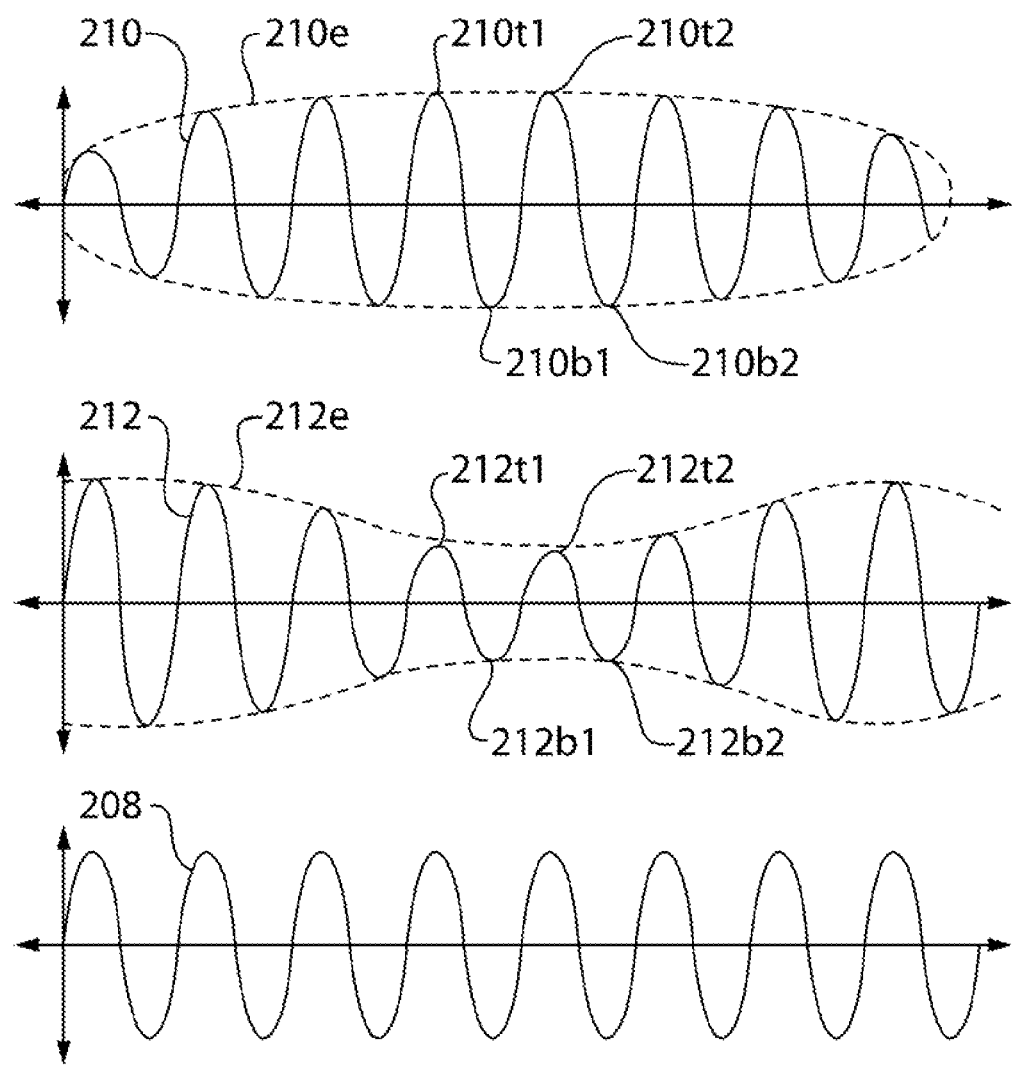
FIG. 6 is a graph showing a resolver input signal to a resolver and resolver output signals generated by the resolver, utilized in the motor control system shown in FIG. 5.

For example, the excitation signal 208 may have a frequency of 12 kHz. The peak detectors 10 and 90 are configured to identify the positive and negative peaks in every sinusoidal cycle of about 83 microseconds, and thus will provide a trigger on line 225 approximately every 42 microseconds. For example, the peak detectors 10 and 90 will instruct the A/D converter 224 to sample the resolver output signal 210 at peak points 210$t$1, 210$b$1, 210$t$2, 210$b$2, . . . (see FIG. 6), and to sample the resolver output signal 212 at peak points 212$t$1, 212$b$1, 212$t$2, 212$b$2, . . . . As illustrated in FIG. 6, the timing of the peak points in the resolver output signals 210 and 212 occur at the same time because the underlying carrier signals are synchronized to one another and the excitation signal. Once the A/D converter 224 has sampled the resolver output signals 210 and 212, the microcontroller generates or recovers two digital modulation signals represented by the envelopes 210$e$ and 212$e$ of output signals 210, 212, representing the sine of the rotor angle and the cosine of the rotor angle, respectively. The microcontroller 204 calculates the rotor angle by determining a trigonometric inverse of the sinusoidal rotor angle function, such as calculating the arctangent of the sine and cosine of the rotor angle values. For example, at a certain time, the sine of the rotor angle is provided by the value of amplitude peak 210$b$1, the cosine of the rotor angle is provided by the value of amplitude peak 212$b$1, and the rotor angle is determined by the arctangent of the ratio of these values. The arctangent function is well known in the art and may be provided, for example, through a lookup table. The peak detectors 10 and 90 thus enable a relatively accurate reading of the amplitude-modulated resolver output signals 210 and 212 which consequently enables the microcontroller 204 to relatively accurately determine the rotor angle.

In alternative embodiments, the resolver output signals 210 and 212 may not be synchronized with the excitation signal 208. In this case, provided the resolver output signals 210 and 212 are synchronized to one another or the phase relationship of output signals 210 and 212 is known, one of the output signals 210 and 212 may be provided as the input to the peak detector 10, 90. As a further alternative, it is also contemplated that two peak detectors 10 or 90 may be used, with one peak detector receiving the output signal 210 as an input and the other peak detector 10 or 90 receiving the other output signal 212 as an input. In this case, the output of each peak detector may be used to trigger two instances of the A/D converter 224.

Once the microcontroller 204 obtains the redundant reading of the rotor angle (which may be referred to as the redundant rotor angle), the microcontroller 204 compares the redundant reading of the rotor angle against the reading of the rotor angle provided by the RTD 202. If the redundant reading of the rotor angle differs from the reading of the rotor angle provided by the RTD 202 by less than a threshold amount, which may depend on the speed of the rotor, then the microcontroller 204 may determine that the rotor angle provided by the RTD 202 is accurate and may proceed to determine and apply the appropriate currents to the field windings by controlling the gate drive circuitry 306 as known in the art. However, if the redundant reading of the rotor angle differs from the reading of the rotor angle provided by the RTD 202 by more than a threshold amount, then the microcontroller 204 may indicate a fault condition to the vehicle control system. Various strategies may then be put into effect such as cutting off current to the motor 302 (FIG. 5) in order to prevent possible damage, running additional diagnostics to determine which component is at fault, or defaulting to a 'limp home' commutation scheme.

The threshold amount for determining an error or fault in the RTD 202 may depend on a variety of factors. For one thing, the redundant rotor angle determination and the RTD rotor angle determination are asynchronous to one another and during the intervening time the rotor will have moved. For this reason the limits of acceptable error may vary with the motor speed because the angle change will be greater at higher speeds in a given time window. There is also some error in each measurement technique as well. For these reasons, a reasonable threshold for determining an error or fault in the RTD 202 may be a plus or minus six degree difference between the redundant rotor angle determination and the RTD rotor angle determination.

It will be noted that in the motor control application represented in FIGS. 5-7, the output of the peak detector (provided, for example, by the output of the RS flip flop 32) is used to trigger an A/D converter to read the amplitude of an input wave and it is desirable to determine the peak voltage of that amplitude. As seen in the view of FIG. 3, the differentiators in the high pass filter block 26 provide sinusoidal output signals 62 and 64 that slightly lead the sinusoidal input signal 60, resulting ultimately in the RS flip flop output signal that will also slightly lead the voltage peak in the sinusoidal input signal 60. This lead, which may be considered an anticipatory signal, will provide for an accurate sample of the peak voltage because it enables downstream circuitry such as the A/D converter, which requires some set up time, to sample the sinusoidal input signal 60 at the right time. A lagging trigger signal would introduce error that may have to be compensated for.

While not intending to be bound by any theory, the inventors believe that the rationale explaining why the differentiator output signals lead the sinusoidal input signal 60 can be understood by considering a single cycle of the sinusoidal input signal 60, segmented as follows:

(1) Using the differentiator provided by R2 and C2 in the peak detector 10 as an example, the bottom level of the cycle will be considered. As the sinusoidal input signal 60 approaches the lowermost voltage of the sinusoidal input signal 60 on the input side of the capacitor C2 at node 23, the output side voltage at node 27B is composed of the voltage on the input node 23 plus the charge of the capacitor C2. Noting the polarities, the input node 23 is negative and the voltage at the output node 27B is slightly more negative having not fully discharged from the previous peak crossing, through the series resistor R2 to a point where the charge on the capacitor C2 is zero and node 27B is equal to node 23. At this time the capacitor C2 starts to give up a charge, tending to have an output potential equal to the sinusoidal input wave 60. As the capacitor C2 tries to charge at this point the capacitor C2 momentarily reaches the same voltage on the output node 27B as the input node 23 and the sinusoidal output signal 62 crosses over the sinusoidal input signal 60.

(2) The capacitor C2 charges further, raising the output node 27B above the input node 23. Then as time progresses, the input node 23 begins to rise for the next portion of the sinusoidal input signal 60. The capacitor C2 continues to charge towards the level of the sinusoidal input signal 60 but that voltage is rising as well. Thus it appears that the voltage at the input node 23 follows the voltage at the output node 27B. As the capacitor C2 rises to reach neutral at node 25, the input node 23 follows the output node 27B upward.

(3) As the input and output nodes 23, 27B rise quickly towards the upper peak, the current produced by the voltage apparent on the resistor R2 (load) to neutral node 25 is equivalent to the current the sinusoidal input signal 60 will provide and so the capacitor 62 is unable to gain any charge. Therefore the sinusoidal input signal 60 provides all the current to the resistor R2 which prohibits any additional voltage to further charge the capacitor C2.

(4) Near the positive crest of the sinusoidal input signal 60, the sinusoidal input signal 60 begins to no longer provide the current to the resistor R2 to raise the voltage of the output node 27B higher, and again the capacitor C2 begins to change its charge. However, at this time the capacitor C2 needs to charge lower at the output and the voltage on the output node 27B becomes nearer to the sinusoidal input signal 60. This progresses until the point where the sinusoidal output signal 62 becomes equal again and then crosses the sinusoidal input signal 60 as seen in FIG. 2.

(5) The capacitor C2 charges and the voltage on the output node increases rapidly in charging toward neutral. However as capacitor C2 charges, the voltage at the input node 23 starts to fall lower and begins again to provide all current capable through the resistor R2 and the capacitor C2 is again unable to change voltage. Once again, the voltage at the input node 23 appears to be chasing the voltage at the output node 27B as this transpires, though downward this time. The cycle repeats as the sinusoidal input signal 60 reaches a negative peak.

Additionally, the peak detectors 10 and 90 may adjust the transition points of the anticipatory trigger signal by manipulating the amplitudes of the sinusoidal output signals 62 and 64. As discussed above, in the peak detectors 10 and 90 the amplitudes of the sinusoidal output signals 62 and 64 are equalized using resistor RE. However, if the amplitude of one of the sinusoidal output signals 62 and 64 is smaller than the amplitude of the other of the sinusoidal output signals 62 and 64, then the instant when the comparator U3/U4 or U5 switches relative to the sinusoidal input wave 60 will shift in time. In particular, the instant at which the comparator U3/U4 or U5 switches can be adjusted relative to the peak of the sinusoidal input wave 60, depending on which of the sinusoidal output signals 62 and 64 is smaller, and depending on which portion of the sinusoidal input wave 60 is being discerned. For example, if the negative peak is utilized to trigger an A/D sample, then as seen best in FIG. 3, the amplitude of the sinusoidal output signal 62 can be made larger than the amplitude of the sinusoidal output signal 64 to shift the crossover point 66 to further precede the negative peak 68 of the sinusoidal input signal 60. Thus, the amplitude of at least one of the first and second sinusoidal output signals 62 and 64 can be adjusted, so as to adjust the time period by which the crossover instances lead the peaks of the sinusoidal input signal.

Figure 8:
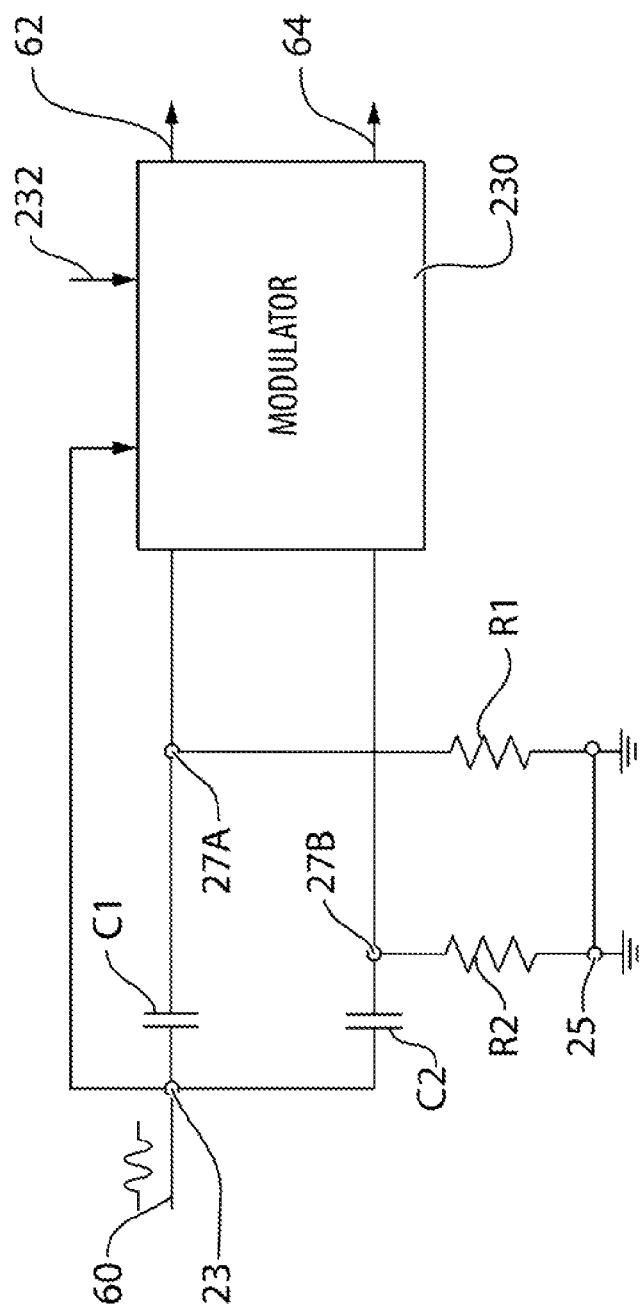
FIG. 8 is a circuit diagram showing an example of another form of differentiator which may be used in the peak detector circuits shown in FIG. 1 or 4.

In a further alternative shown in FIG. 8, a modulator 230 may be employed to selectively shift the amplitudes of one or both of the sinusoidal output signals 62 and 64 generated by the differentiators. The modulator may, for example, be positioned in the circuit shown in FIG. 1 between the differentiator block 26 and the comparator block 28. The modulator 230 may be controlled by a modulation signal in order to change the lead, or lag, of the sinusoidal output signals 62 and 64 relative to the sinusoidal input signal 60. For example, if a speed or frequency dependent time shift were desired, then the modulator 230 may receive the sinusoidal signal, derive the frequency of the sinusoidal signal, and proportionally adjust the amplitude of one or both of the sinusoidal output signals 62 and 64 using suitable summing circuits known in the art. Additionally or alternatively, a control signal 232 representing a voltage, temperature, current or sensitivity input could be applied to the modulator 230 to adjust the relative amplitudes of the sinusoidal output signals 62 and 64.

It will also be noted that adjusting the time constants associated with the differentiators so as to change the difference between the time constants will also shift the position of the crossover point 66.

In addition, while the differentiators discussed above utilized the output of the DC reference level generator block 24 as a reference voltage at node 25, it will be noted that because the sinusoidal output signals 62 and 64 are capacitively coupled in the high-pass filter 26, any reference voltage may be used. For example, as long as the sinusoidal output signals 62 and 64 stay within the comparator input operating range, the ground reference may be used as shown in FIG. 8 and the DC reference level generator block 24 may be omitted from the peak detectors 10 and 90. However, the use of a derived center reference voltage can offer benefits in case the capacitors C1 and C2 have a leakage current that may not be similar and which could cause error, whereas a derived reference voltage will at least keep the capacitors centered. This may be particularly desirable when high temperatures are present, for example in automotive applications, so as to increase the expected life of the circuit.

While the above description constitutes specific examples, these examples are susceptible to further modification and change without departing from the fair meaning of the accompanying claims.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A circuit for detecting peaks in a sinusoidal input signal, comprising:

a first differentiator and a second differentiator arranged in parallel with the first differentiator, wherein the first differentiator has a different time constant than the second differentiator, wherein the first and the second differentiators generate first and second sinusoidal output signals that are based on the sinusoidal input signal and that are out of phase with one another and with the sinusoidal input signal, wherein the first and second sinusoidal output signals lead the sinusoidal input signal;

a comparison block that receives the first and second sinusoidal output signals and generates first and second square wave signals having transitions substantially coinciding with crossover instances where the first and second sinusoidal output signals cross over each other, whereby said transitions are indicative of the timing of peaks in the sinusoidal input signal, wherein the comparison block incorporates dual comparators that generate the first and second square wave signals;

third and fourth differentiators arranged in parallel which receive the first and second square wave signals, respectively, and generate first and second trigger signals; and a dual input flip flop connected to the third and fourth differentiators, wherein the flip flop is set and reset by the first and second trigger signals.

2. A circuit as claimed in claim 1, wherein each of the first and second differentiators includes a first input terminal connected to a capacitor, a second input terminal connected to a resistor, and an output terminal connected to the resistor, and wherein the first input terminal receives the sinusoidal input signal, the second input terminal receives a DC reference voltage, and the differentiator output terminal is connected to the comparison block.

3. A circuit as claimed in claim 2, wherein the DC reference voltage is provided by a DC reference level generator and is representative of a DC bias voltage carried by the sinusoidal input signal.

4. A circuit as claimed in claim 1, further comprising an additional resistor connected to the capacitor of at least one of the first and second differentiators, wherein the additional resistor is sized to adjust the amplitude of at least one of the first and second sinusoidal output signals so that the amplitudes of the first and second sinusoidal output signals are substantially equal to each other.

5. A circuit as claimed in claim 1, wherein the time constants are selected so that the amplitude of one of the first and second sinusoidal output signals is smaller than the amplitude of the other of the first and second sinusoidal output signals so as to control by how much the crossover instances of the first and second sinusoidal output signals lead the peaks of the sinusoidal input signal.

6. A circuit as claimed in claim 1, further comprising a modulator connected to the first and second differentiators for adjusting the relative amplitudes of the first and second sinusoidal output signals based on a control signal.

7. A circuit as claimed in claim 6, wherein the input signal comprises at least one of: a frequency of the sinusoidal input frequency; a current, a voltage; a temperature; and a sensitivity value.

8. A circuit as claimed in claim 1, wherein the comparison block incorporates a single comparator that generates a single square wave signal, and wherein a current source is connected to an output of the comparator to provide rising edge and falling edge transitions in the single square wave signal.

9. A system for controlling the commutation of an electric motor having a rotor and a resolver that provides feedback as to the rotor angle, comprising:
- a resolver circuit;
- a microcontroller connected to the resolver circuit via a communications bus, wherein the resolver circuit generates a sinusoidal excitation signal that is applied to the resolver, the resolver generates at least one amplitude-modulated sinusoidal resolver output signal in response to the excitation signal, the resolver circuit receives and decodes the at least one resolver output signal to provide rotor angle information to the microcontroller over the communications bus, wherein the microcontroller controls the commutation of the motor based on the rotor angle information; and
- a redundant rotor angle feedback circuit including a peak detector, wherein the microcontroller receives the at least one resolver output signal, and the peak detector receives one signal selected from the sinusoidal excitation signal and the at least one resolver output signal and generates a trigger signal that is sent to the microcontroller to inform the microcontroller when to sample the at least one resolver output signal, the microcontroller redundantly determining the rotor angle based on the at least one resolver output signal and the trigger signal, wherein the peak detector includes first and second differentiators and a comparison block, wherein the first and second differentiators are arranged in parallel, the first differentiator having a different time constant than the second differentiator, wherein the excitation signal is applied to each of the first and the second differentiators to generate first and second sinusoidal output signals that are out of phase with one another and with the excitation signal, and wherein the comparison block receives the first and second sinusoidal output signals and generates the trigger signal which has transitions based on crossover instances where the first and second sinusoidal output signals cross over each other, whereby said transitions are indicative of the timing of peaks in the excitation signal and the at least one resolver output signal.

10. A system as claimed in claim 9, wherein the microcontroller samples the at least one resolver output signal via a digital to analog converter circuit, and wherein the first and second differentiators provide the first and second sinusoidal output signals so as to lead the excitation signal.

11. A method for controlling the commutation of an electric motor having a rotor and a resolver that provides feedback as to the rotor angle, the method comprising:
- (a) determining a rotor angle of the rotor using a resolver circuit, wherein the resolver circuit generates a sinusoidal excitation signal that is applied to the resolver, the resolver generates at least one amplitude-modulated sinusoidal resolver output signal in response to the excitation signal, and the resolver circuit receives and decodes the at least one resolver output signal to provide the rotor angle;
- (b) commutating the motor based on the rotor angle provided by the resolver circuit;
- (c) determining a redundant rotor angle by generating first and second sinusoidal output signals of the same frequency as the excitation signal that are out of phase with one another and with the excitation signal, comparing the first and second sinusoidal output signals to determine crossover instances where the first and second sinusoidal output signals cross over each other, detecting the crossover instances and sampling the at least one amplitude-modulated signal at times corresponding to the crossover instances in order to generate a digital modulation signal, and determining the redundant rotor angle by calculating a trigonometric inverse of a value based on the digital modulation signal; and
- (d) comparing the rotor angle provided in step (a) against the redundant rotor angle provided in step (c) so as to provide a diagnostic condition of the resolver circuit.

12. A method as claimed in claim 11, wherein the first and second sinusoidal output signals lead the excitation signal.

\* \* \* \* \*